United States Patent
Gannoune et al.

(10) Patent No.: US 7,291,902 B2
(45) Date of Patent: Nov. 6, 2007

(54) CHIP COMPONENT AND METHOD FOR PRODUCING A CHIP COMPONENT

(75) Inventors: Youssef Gannoune, Munich (DE); Christian Stocken, Munich (DE)

(73) Assignee: Infineon Technologies AG, Munich (DE)

( * ) Notice: Subject to any disclaimer, the term of this patent is extended or adjusted under 35 U.S.C. 154(b) by 85 days.

(21) Appl. No.: 11/304,491

(22) Filed: Dec. 15, 2005

(65) Prior Publication Data

US 2006/0163600 A1   Jul. 27, 2006

(30) Foreign Application Priority Data

Dec. 15, 2004   (DE) ...................... 10 2004 060 367

(51) Int. Cl.
*H01L 23/02* (2006.01)
(52) U.S. Cl. ............... 257/678; 257/665; 257/680; 257/684; 257/718; 257/781; 257/434; 257/E23.149
(58) Field of Classification Search ............... 257/209, 257/665, 528–530, 678–733, 787–796, E23.001, 257/E23.194
See application file for complete search history.

(56) References Cited

U.S. PATENT DOCUMENTS 4,764,800 A   8/1988   Sander
5,256,901 A   10/1993  Ohashi et al.
6,255,715 B1 *  7/2001  Liaw ........................... 257/529
6,507,087 B1 *  1/2003  Yu ............................... 257/529

FOREIGN PATENT DOCUMENTS

| DE | 689 21 452 T2 | | 9/1995 | |
| EP | 0 245 014 A2 | | 11/1987 | |
| JP | 1-304755 | * | 12/1989 | .................. 257/680 |
| JP | 2-146750 | * | 6/1990 | .................. 257/680 |
| WO | WO 97/124401 | * | 4/1997 | |

* cited by examiner

*Primary Examiner*—Jasmine Clark
(74) *Attorney, Agent, or Firm*—Slater & Matsil, L.L.P.

(57) ABSTRACT

A chip component (1) includes a semiconductor body (2), in which at least one switchable element (6, 62) is arranged in a partial region (24) of the semiconductor body (2). The partial region (24) can be reached by light of at least one wavelength. Furthermore, a circuit (9) integrated into the semiconductor body (2) is provided, which integrated circuit can assume one configuration from at least two possible configurations, one of these configurations being prescribed by a state of the at least one switchable element (6, 62). Furthermore, a housing (3) is provided, which encloses the semiconductor body (2) and is arranged with a partial region (35, 32) at least partly above the partial region (24) of the semiconductor body (2). The partial region (35, 32) of the housing (3) is formed in such a way that light can be fed to the partial region (24) of the semiconductor body (2). It is thus possible even after a fabrication process to carry out a test and, if appropriate, to define a different configuration through switching of the element (6, 62).

12 Claims, 5 Drawing Sheets

CHIP COMPONENT AND METHOD FOR PRODUCING A CHIP COMPONENT

This application claims priority to German Patent Application 10 2004 060 367.7, which was filed Dec. 15, 2004, and is incorporated herein by reference.

TECHNICAL FIELD

The present invention relates to a chip component and to a method for producing such a chip component.

BACKGROUND

The present-day fabrication of chip components and in particular of memory components is becoming increasingly complex on account of ever decreasing dimensions. By way of example, in current memory components the number of individual memory cells is reaching the 1 Gbit limit. Memory modules with a size of 512 Mbytes in which a plurality of individual memory components of this type are arranged on a circuit board have become commercially available in the meantime.

It is evident that the fabrication of a large number of memory cells in a semiconductor body of the memory component including the drive logic for the individual cells can lead to defects and failures of memory cells. Therefore, modern memory components contain redundant memory cells and switching elements which replace the failed elements in the event of memory cells failing or switching elements failing. Identifying defective elements of a memory component requires a memory test which is carried out, inter alia, at the wafer level during a fabrication step. After an identification, fusible links are severed in order to activate redundant elements. Such fusible links are generally referred to as fuses.

By way of example, a number of fuse elements which replace defective memory cells are provided in a memory component. These fusible links or fuses are severed in such a way that in the event of later addressing of a defective memory cell, the redundant memory element is accessed instead of the defective memory cell.

Through the blowing of the fuses or the fusing of the fusible links in a late fabrication phase of the memory component, one specific configuration is selected from a plurality of possible configurations and finally defined by selective blowing of the fuses. The fusible links are often fused by means of a laser-induced process which destroys a thin metallic line acting as a fusible link at the location provided therefor and thus interrupts the connection.

One fundamental problem with this fabrication process is that the test operation and the configuration of the memory component are effected at the wafer level. Only afterward is the semiconductor body, the so-called "die", surrounded with a housing, the "package", as a result of which the semiconductor body can no longer be accessed later with a laser. The memory component is subsequently processed further and applied to a memory module. The process of soldering the memory component onto the memory module during further fabrication processes exerts a severe thermal stress on the memory module and the memory component. Temperatures of up to 200° C. are reached, whereby individual memory cells or other elements within the memory component are possibly damaged and may fail.

At this point in time in the fabrication method the fuses of the memory are no longer accessible, with the result that the cells that have then failed cannot be replaced. Although in some instances only individual memory cells of the memory component are defective, the component must nevertheless be rejected as defective, as a result of which the fabrication costs increase and the component yield decreases.

It is an object of the present invention to specify a chip component and preferably a memory component in which the failure rate is lower. Furthermore, it is an object of the invention to provide a fabrication method which is more cost-effective and leads to low failure rates.

With regard to the arrangement, the object is achieved by means of a chip component comprising a semiconductor body. At least one switchable element is arranged in a partial region of the semiconductor body. The partial region can be reached by light of at least one wavelength for the switching of the element. Furthermore, an integrated circuit is provided in the semiconductor body, said integrated circuit being embodied for assuming one configuration from a first and at least one second possible configuration. The first and at least one second configuration are formed such that they can be selected by means of the at least one switchable element. One configuration of the first and at least one second configuration is defined by a state of the at least one switchable element. Finally, a housing encloses the semiconductor body and comprises a partial region which is arranged at least partly above the partial region of the semiconductor body. The partial region of the housing is formed in such a way that the light can be fed to the partial region of the semiconductor body.

As a result, the region of the switchable element of the semiconductor body remains able to be reached even after the semiconductor body has been embedded in a surrounding housing. In late fabrication steps or after fabrication, a configuration of the integrated circuit of the semiconductor body can still be selected and be defined through a change in the state of the at least one switchable element. Defective switching elements of the semiconductor body which are produced in later fabrication steps of the production process can thus be repaired. In particular, defective memory cells in a memory component can be replaced by redundant cells.

In one preferred embodiment, at least the partial region of the housing is formed with a light-transmissive material and preferably with a transparent plastic or with glass. The light-transmissive material advantageously permits access to the switchable elements, for example by light and in particular by a laser beam.

In this connection it is expedient to form at least one switchable element with a fusible link. Preferably, the at least one switchable element is formed as a one-time switchable element, a first switching state of the element being given by an electrical conductivity and a second switching state of the element being given by a blocked state. The second switching state is preferably formed by blowing or fusing. One configuration from a multiplicity of possible configurations of the integrated circuit is thus defined by selective destruction of the at least one switchable element. The first switching state of the element is given when the latter is not blown, fused or generally not destroyed. The second switching state of the element is defined by the blown, fused or generally destroyed element.

SUMMARY

It is an object of the present invention to specify a chip component and preferably a memory component in which the failure rate is lower. Furthermore, it is an object of the invention to provide a fabrication method which is more cost-effective and leads to low failure rates.

In another preferred embodiment, the integrated circuit is formed as a writable memory having a multiplicity of addressable memory cells.

In one development of the invention, the partial region of the semiconductor body comprises a first layer, which has the at least one switchable element. A second layer of the semiconductor body is furthermore provided, which is arranged above the first layer and is transmissive to the light of the at least one wavelength. The switchable elements are thus part of the semiconductor body near to a surface thereof, a light-transmissive layer being arranged above the switchable elements and forming mechanical protection against damage.

This is expedient particularly when the integrated circuit of the semiconductor body is integrated in a plurality of layers of the semiconductor body.

Sensitive regions of the integrated circuit which are particularly sensitive to light radiations can thus be arranged in partial regions which are opaque to light of the at least one wavelength. The second layer expediently comprises silicon dioxide or some other material whose band gap is at least partly greater than the energy of the radiated-in light of the at least one wavelength. As a result, light can be fed to the at least one switchable element in the first layer from outside the semiconductor body. Particularly fusible links and so-called laser fuses can be arranged in the first layer in a simple manner.

In another refinement of the invention, it is expedient to form the partial region of the housing with a detachable cover. The detachable cover enables an access to the partial region of the semiconductor body with the switchable element even in later fabrication steps.

In another development of the invention, the housing comprises a body having a depression in which the semiconductor body is arranged. In this case, the partial region of the semiconductor body with the at least one switchable element faces an opening of the depression. Said opening may preferably be closed with a detachable cover.

In another development, an adhesive is provided which reversibly or irreversibly connects the partial region of the housing to the housing. Preferably, the adhesive connects the partial region of the housing to the housing reversibly at first and irreversibly after a final configuration of the integrated circuit.

In another development of the invention, the housing contains a groove, a hotch or a spring at at least one side wall. Furthermore, provision is made of a cover which closes the opening of the depression and comprises a spring or groove corresponding to the groove or spring of the housing. The cover for closing the opening of the housing can thus be pushed onto the latter.

With regard to the fabrication method, the object is achieved by means of a method comprising the steps of:
  providing a semiconductor body;
  forming at least one switchable element in a partial region of the semiconductor body;
  forming an integrated circuit in the semiconductor body, which integrated circuit can assume a first and at least one second configuration, one configuration of which can be selected by means of a switching state of the at least one switchable element;
  surrounding the semiconductor body with a housing, the partial region of the semiconductor body being surrounded in such a way that the partial region of the semiconductor body is left free or remains able to be reached by light;
  selecting one configuration from the first and at least one second configuration of the integrated circuit.

What is achieved by means of the method according to the invention is that a configuration of the integrated circuit within the semiconductor body through switching of the at least one switchable element remains possible even after the semiconductor body has been surrounded with the housing, the packaging. This is preferably achieved by virtue of the fact that the partial region of the semiconductor body in which the switchable element is situated is left free by the housing. Defective elements which are produced during the individual fabrication steps within the integrated circuit can thus be replaced by redundant elements through selection of a corresponding configuration of the integrated circuit. Consequently, it is possible to provide defect correction by selective configuration of the integrated circuit at the end of a fabrication process. As a result, the yield of the fabrication process is increased and the costs are lowered.

In one development of the method, the step of forming the at least one switchable element comprises providing a fusible link and arranging the fusible link in the partial region of the semiconductor body. In this case, the fusible link is arranged in such a way that it can be fused, severed or destroyed by light radiated in from outside the semiconductor body. As an alternative to this, the switchable element may also be formed as an antifuse, which can be melted by light in such a way that an electrically conductive connection arises.

In another refinement of the invention, a configuration of the integrated circuit is selected in such a way that, in a first step, the integrated circuit is tested with regard to its error-free function. It is thus ascertained whether an error is present in the functions of the integrated circuit. One configuration from the first and the at least one second configuration in which the error-free function of the integrated circuit is ensured is then determined. In a manner dependent on the configuration determined, at least one of the at least one switchable element is switched for the selection and definition of this configuration. The switching operation of the switchable element is preferably effected by fusing the switchable element or destroying it in some other way.

In another development of the invention, provision is made of contact connections for the operation of the integrated circuit at the semiconductor body. Furthermore, a circuit board is provided, and the contact connections are fixed to the circuit board by means of a thermally induced process, preferably by means of a soldering process. Since particularly severe thermal stresses can occur during said soldering process, leading to damage to circuits of the semiconductor body, it is expedient subsequently to test the functions of the integrated circuit in the semiconductor body and to select a corresponding configuration through switching of the element on the basis of the test result.

In another development of the invention, the step of surrounding the semiconductor body comprises embedding the semiconductor body in a housing, the partial region of the semiconductor body being left free by the housing. In another development of the invention, the step of surrounding the semiconductor body comprises the steps of:
  providing a housing having a depression for the semiconductor body;
  arranging the semiconductor body in the depression, the partial region of the semiconductor body facing the opening of the depression;
  and providing a cover for closing the opening.

It is expedient as a last step in particular after the selecting step to irreversibly surround the partial region of the semiconductor body with the housing. In one design, the housing is closed with the cover. This avoids further damage to the semiconductor body.

BRIEF DESCRIPTION OF THE DRAWINGS

The invention will now be explained in detail on the basis of exemplary embodiments with the aid of the drawings, in which:

FIG. 8 shows a chip component having a housing 3 and a plurality of connection contacts 38. The housing 3 is formed with a plastic that completely encloses a semiconductor body (not illustrated in FIG. 8) and thus forms mechanical protection against damage. The various connection contacts 38 lead within the plastic body 3 to connection locations on the surface of the semiconductor body. An integrated circuit is arranged within the semiconductor body, which is also referred to as a "die", and is connected to the connection locations on the surface of the semiconductor body.

Via said connection locations, the integrated circuit is fed a supply current and a supply voltage for operation of the circuit. During operation, the integrated circuit is fed signals for example via further connection locations, which signals are processed by the integrated circuit. Signals are likewise output by the circuit. In one exemplary embodiment, the integrated circuit forms a memory having a multiplicity of memory cells for storing data which are fed to the circuit by means of signals.

A connection between the contact connections 38 and the contact locations on the surface of the semiconductor body integrated in the housing is often effected by means of bonding wires. A semiconductor body with a circuit of this type which is surrounded by a housing as illustrated in FIG. 8 is referred to as a memory component.

Figure 8:
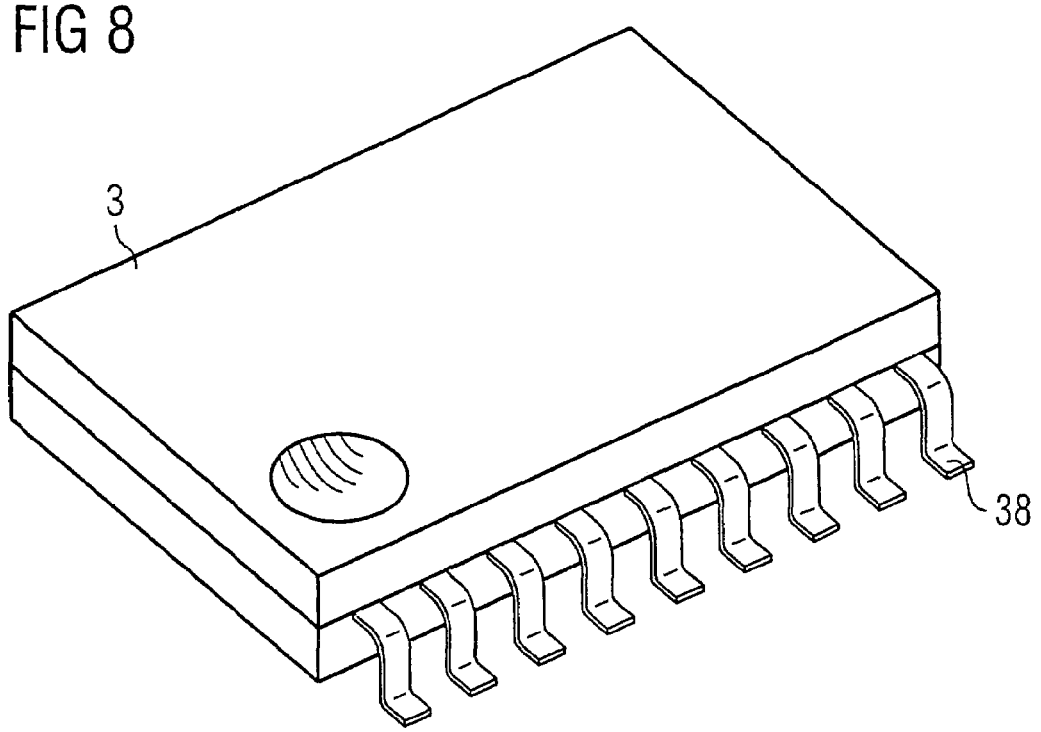
FIG. 8 shows a known chip component.

The chip component illustrated in FIG. 8 is then fixed on a circuit board by means of a soldering process. For this purpose, the connection contacts 38 are arranged on a circuit board prepared with soldering tin and the entire arrangement is passed through a furnace. The temperatures for this soldering process are in the region of 200° C. or even higher. At these temperatures it can happen that, on account of the high thermal conductivity of the metallic contact connections 38, heat couples into the semiconductor body via the contact connections and the bonding wires. Measurements carried out by the applicant suggest that the temperature of the semiconductor body during the soldering process corresponds approximately to the temperature of the soldering process. These high temperatures can lead to alterations of the material in the semiconductor body. These include thermally induced diffusion processes that change the electrical properties of the semiconductor body and of the integrated circuit. As a result, these diffusion processes are manifested by defects or the failure of individual elements of the integrated circuit.

Precisely in the area of the memory components this has the effect that memory cells within the memory component can fail.

Figure 1:
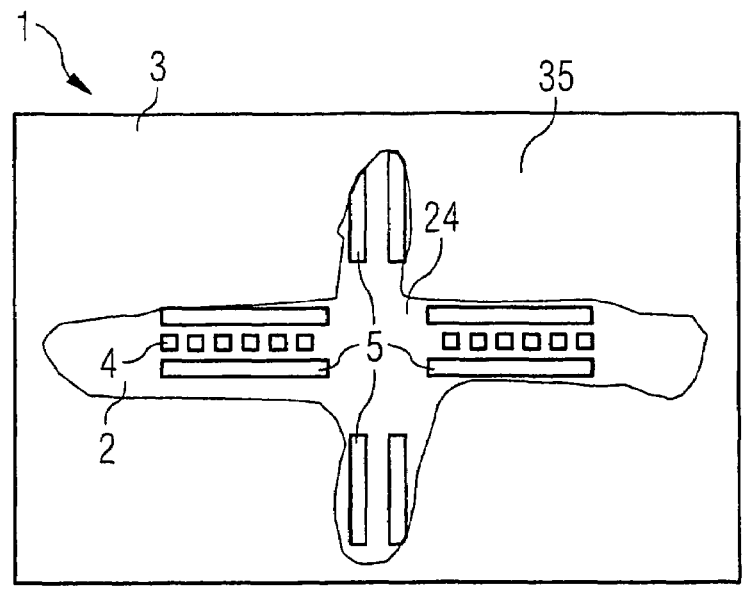
FIG. 1 shows a first exemplary embodiment of the invention.

FIG. 1 shows a plan view of a chip component 1, in particular of a memory component, according to the invention. The connection contact locations are not illustrated here for reasons of clarity. The chip component comprises a housing 3 and also a semiconductor body 2 arranged within the housing 3. An integrated circuit is in turn realized within the semiconductor body 2. The integrated circuit contains a multiplicity of memory cells, and also a logic for driving the individual memory cells. The connections that are not illustrated supply the circuit with the signals, voltages and currents required for operation. The housing 3 surrounding the semiconductor body 2 and thus the integrated circuit is referred to as a "package" and is usually formed from a plastic.

The semiconductor body 2 has a partial region 24 comprising a light-transmissive material on its surface. By way of example, this is silicon dioxide, silicon nitride or some other material whose band gap is greater than the energy of a light of one wavelength. Regions below the material in the partial region 24 can thereby be irradiated by light.

So-called fuse banks 5 are situated just beneath the light-transmissive layer of the semiconductor body. Said fuse banks contain a multiplicity of individual fuses in the form of so-called fusible links. The individual fusible links within the fuse banks 5 serve for addressing a redundant memory cell for the case where some of the normally used memory cells of the integrated circuit have failed.

When addressing memory cells of the integrated circuit in the semiconductor body 2, logic elements of the integrated circuit evaluate the state of the fusible links. Depending on the evaluation, other, redundant address lines selected by means of the fusible links are activated. Address lines with defective memory cells are thus replaced. In addition, individual defective memory cells can possibly also be replaced by redundant memory cells. The defective memory cells are replaced overall by means of a corresponding configuration of the fuse banks 5.

Contact pads 4 are furthermore provided, which are connected to the contact connection locations via bonding wires (not illustrated).

A partial region 35 that is completely cut out is provided in the housing or package 3. In the course of the fabrication and in particular in the course of the embedding of the semiconductor body 2 with the memory into the housing 3, the partial region of the semiconductor body 2 below which the fuse banks 5 are situated remains open and accessible. As a result, it remains possible, even in later fabrication steps, in particular after a positioning and a soldering process on a circuit board, still to access the fuse banks 5 and the fusible links contained therein. Consequently, a final configuration of the fuse banks 5 or of the individual fusible links is not performed until after fabrication on the circuit board in a final process step.

In the present exemplary embodiment, the memory in the semiconductor body 2 is tested after fabrication to establish whether its implemented functions are error-free. By way of example, failed memory cells are determined, and a configuration is selected for the fuse banks 5 and the individual fusible links in order to replace the defective memory cells of the integrated circuit by redundant memory cells. In this case, an entire address line can expediently be replaced by a redundant address line. This is practical when a plurality of memory cells are defective in a word line. It is also possible, of course, to select other configurations, for example individual memory cells, or else bit lines, if this is provided.

In a laser-induced process, the selected fusible links are subsequently destroyed, and a configuration of the integrated circuit or memory is established in a committed manner. If a formerly defective memory cell is addressed during operation, then on account of the configuration prescribed by the fusible links, the redundant memory cell is selected and accessed rather than the defective memory cell. In the present case, after defining the configuration of the integrated circuit by means of the fusing process of the fusible links of the individual fuse banks 5, additional plastic may be put into the partial region 35. The partial region 35 is thereby closed irreversibly.

It may likewise be expedient to fill the partial region 35 with a transparent plastic during the packaging process. This has the advantage that the individual fusible links in the fuse banks 5 can still be accessed even in later fabrication steps. It is therefore conceivable even to repair ageing-dictated failure phenomena in the memory cells at a later point in time.

Figure 2:
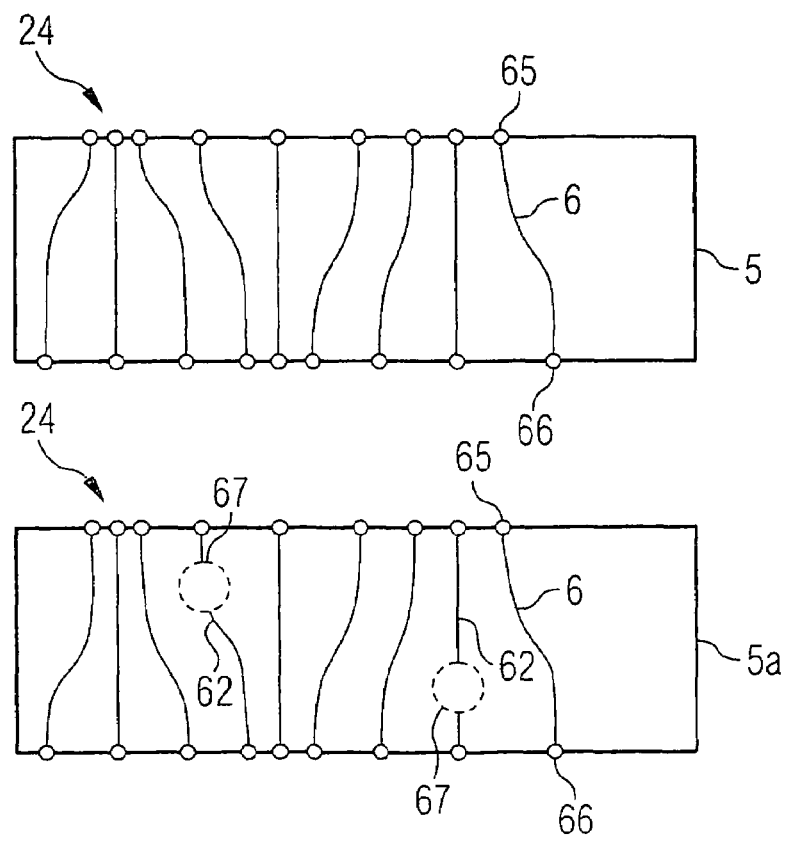
FIG. 2 shows two partial regions of the semiconductor body which have a different configuration.

FIG. 2 shows an exemplary embodiment of a fuse bank 5 in a partial region 24 of the semiconductor body 2 and also a fuse block 5a in a different configuration. The fuse bank 5 comprises a plurality of fusible links formed as metallic lines 6. Said fusible links are embodied between connection contacts 65 and 66. Their geometrical arrangement within the fuse block is chosen such that the relatively large laser beam can individually fuse the metallic lines without damaging adjacent metallic lines in the process. If, after testing the memory component, the corresponding defective memory cells are identified and the possible replacement configuration is selected, individual fusible links 6 are blown. The connection between the connection contacts 65 and 66 is thereby selectively interrupted.

The fuse bank 5a represents one example of a resulting configuration after the fusing operation. In said fuse bank 5a, the fusible links 62 are fused by a laser-induced process in the region 67 and the connection is interrupted. The selective fusing of individual fusible links in the fuse banks 5 defines one configuration from a multiplicity of possible configurations of the semiconductor memory in the semiconductor body 2. The functional test with the subsequent fusing process can be carried out at a very late point in time within the fabrication process on account of the arrangement according to the invention in FIG. 1. In particular, it is expedient to perform this process only when most of the defect-promoting fabrication process steps have already been concluded. These processes include, inter alia, those which produce a high thermal loading for the semiconductor body 2 and the memory integrated therein.

Figure 3A:
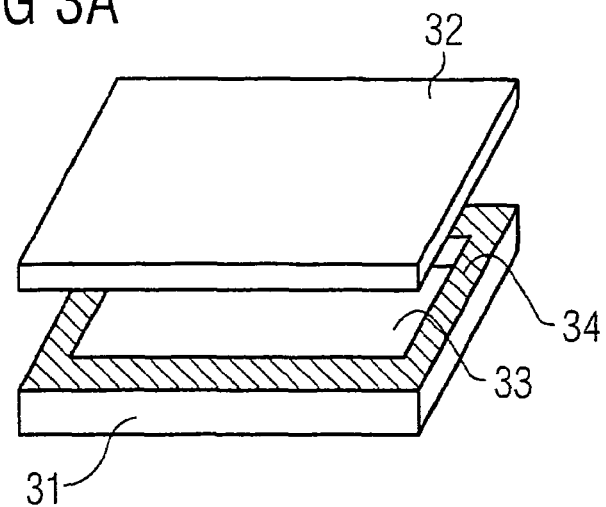
FIG. 3A shows a second exemplary embodiment of the invention in a first partial view.
Figure 3B:
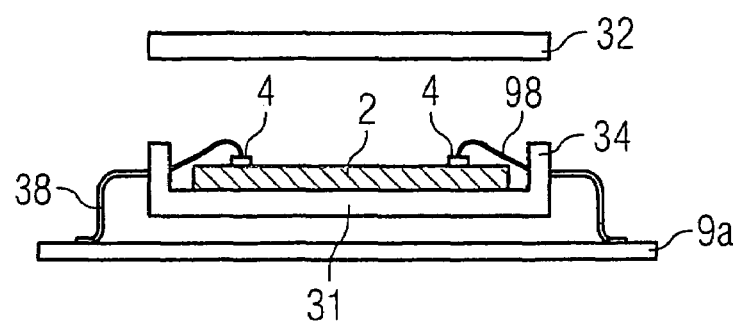
FIG. 3B shows a different view of the second exemplary embodiment.

FIG. 3A shows a further exemplary embodiment of the invention. Here the housing is formed as a body 31 having a depression 33. The semiconductor body with the circuit integrated therein is arranged in said depression 33. As can be discerned in the side view in FIG. 3B, contact connection locations 4 are provided on the surface of the semiconductor body and are connected to corresponding contact connections 38 via bonding wires 98. The connections 38 are in turn connected to corresponding contacts on the surface of a circuit board 9a by means of a soldering process.

A detachable cover 32 which closes the housing 31 is furthermore provided. The detachable cover is composed for example of the same material as the housing 31, preferably of an opaque plastic. It is applied and connected to the rest of the housing 31 irreversibly by means of an adhesive 34 only after a configuration of the integrated circuit through fusing of individual elements in the fuse banks has been concluded.

It is likewise expedient to connect the cover to, the housing reversibly, for example by means of a reversible adhesive 34, in an earlier fabrication step. This has the advantage that the semiconductor body 2 arranged therein is sufficiently protected against damage in the later fabrication steps as well. Only for a functional test or the definition of a final configuration of the circuit integrated in the semiconductor body is the cover removed and subsequently fixed irreversibly to the housing again.

Figure 4:
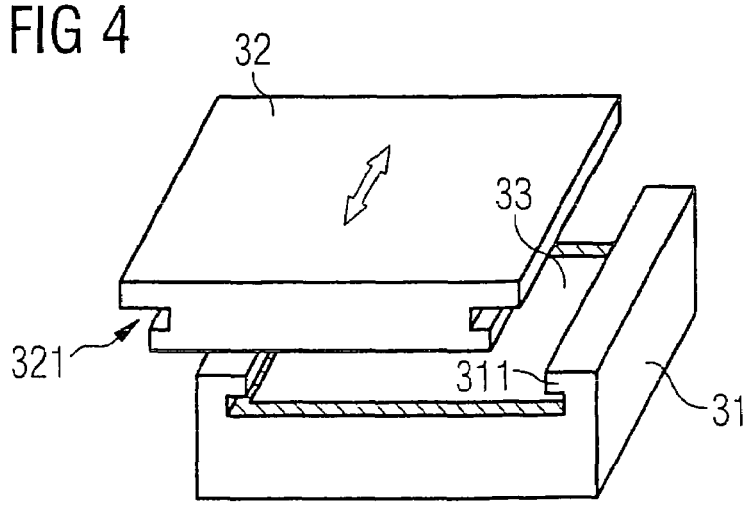
FIG. 4 shows a third exemplary embodiment of the invention.

FIG. 4 shows a further embodiment. In this exemplary embodiment, the cover 32 can be fixed to the housing 31 via a corresponding groove 321. As can be discerned, the side walls of the housing 31 in each case have a corresponding spring 311. The cover can thus be displaced along the direction specified. This arrangement has the advantage that the cover can also be opened very easily at a later point in time and ageing-dictated or application-dictated values of the integrated circuit can be repaired by renewed configuration.

Figure 5:
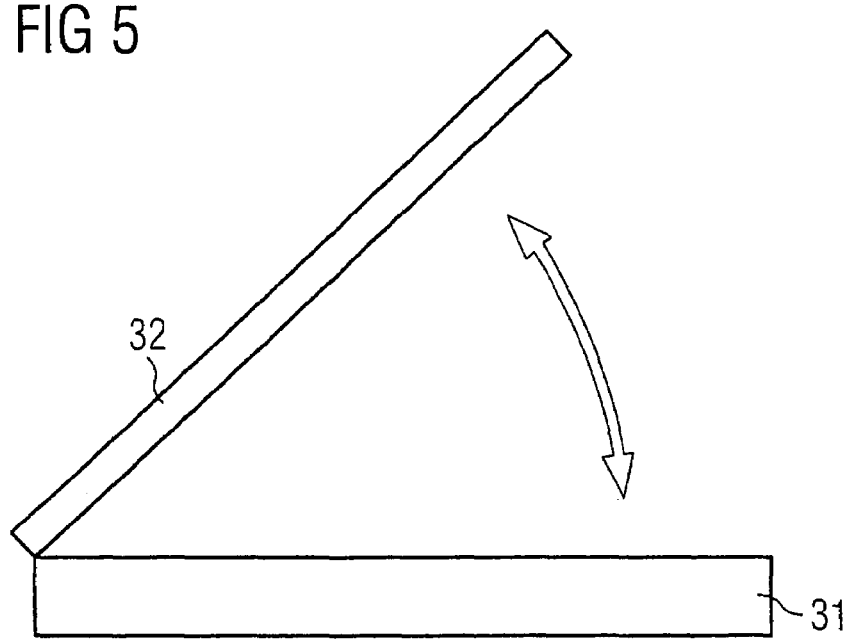
FIG. 5 shows a fourth exemplary embodiment of the invention.

In FIG. 5, the cover is fixed rotatably with the housing 31. It forms a flap which can be opened or closed as required for access to the semiconductor body. In the embodiments illustrated, it is possible at any time to fix the cover to the housing irreversibly by means of an adhesive. However, a detachable cover enables direct access to fuse banks at the surface of the semiconductor body 2, in order thus to configure the integrated circuit at a later point in time and to repair or bridge defective elements.

Figure 6:
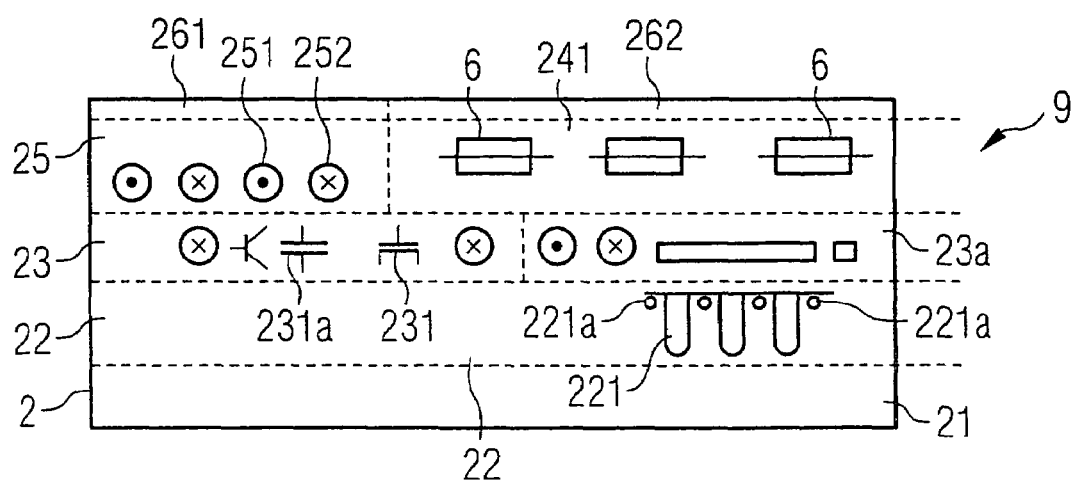
FIG. 6 shows a cross section through the semiconductor body with a circuit integrated therein.

FIG. 6 shows a cross section through the semiconductor body with an integrated circuit 9 contained therein. The integrated circuit 9 is a RAM memory, for example. Owing to the high requirements made of ever greater storage density, it is customary in modern memory generations to arrange individual logic switching elements in different planes of the semiconductor body 2. In the present exemplary embodiment, the integrated memory is formed with different layers arranged one above another, which are referred to as planes. The semiconductor memory 2 has an undoped bulk material 21 as bottommost layer.

This serves for the fabrication of the further planes and layers of the memory. The layers are very often produced by means of deposition and etching processes. A plurality of trench storage capacitors 221 arranged alongside one another are integrated in a second plane 22. Together with switching transistors 221a arranged alongside them, they form the memory cells of the memory. The word and bit lines for driving and for reading the individual memory cells run directly above the memory cells in the plane 23a. Individual memory cells are accessed by selective activation of word and bit line. Logic elements are provided for this purpose, for example address decoders, which in the present exemplary embodiment are arranged alongside the memory cells in the region 23. The logic elements comprise, inter alia, transistors 231, possibly resistors, capacitors 231a and other active and passive components.

A further layer 241 with fusible links 6 situated therein is applied above the plane 23. The fusible links are combined to form fuse banks and serve for the selection of specific redundant memory cells in the event of the failure of individual elements. It is expedient to arrange the fusible links acting as fuse in a layer 241 close to the surface of the semiconductor body. The individual fuses can thereby be accessed and in particular fused in a particularly simple manner. Supply lines 251 and ground lines 252 are accommodated in a further plane.

Situated above the plane 241 with the fusible links is a thin transparent silicon dioxide layer 262 for protecting the fusible links and the underlying elements. Silicon dioxide is a light-transmissive material. It is thereby possible for the individual fusible links to be selectively destroyed by means of a laser, in order thus to define a configuration of the memory 9. A light-opaque layer 261 is applied on the plane 25 with the supply and ground lines. This may be a metal, for example. Damage to underlying layers or elements of the memory due to an erroneously oriented laser beam is thus avoided.

The integrated circuit illustrated here may comprise further planes besides those mentioned. In particular, it is conceivable for the vertical memory cells likewise to be provided on different planes.

Figure 7:
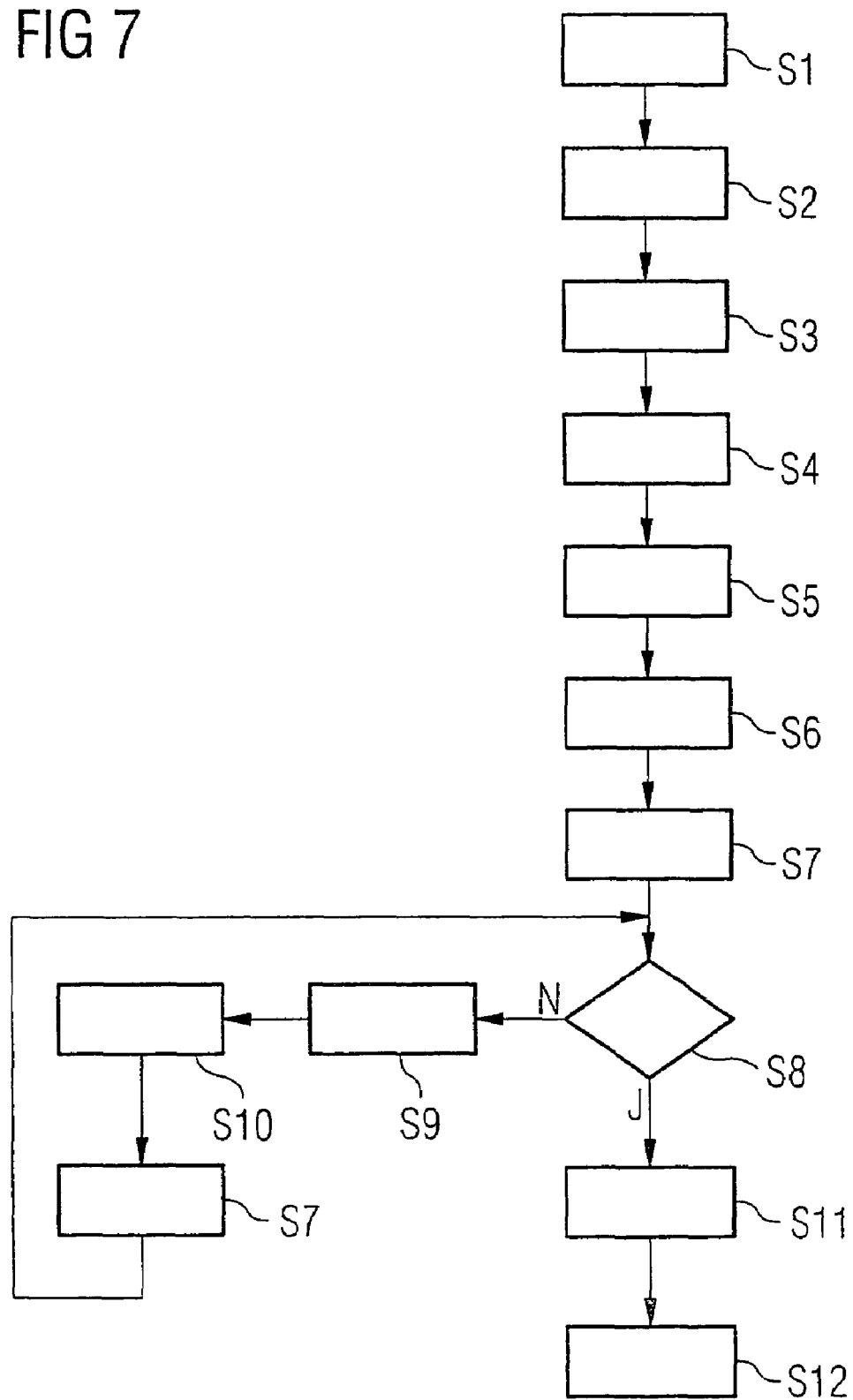
FIG. 7 shows an exemplary embodiment of a fabrication method.

FIG. 7 shows an exemplary embodiment of the method according to the invention for producing a chip component. A first step S1 involves providing a semiconductor body. By way of example, silicon, gallium arsenide, indium phosphide, gallium nitride or other compound semiconductor materials are used as the semiconductor material.

In step 2, the integrated circuit is formed in the semiconductor body. A plurality of individual fabrication steps are performed one after another for this purpose, for example etching processes, deposition processes and exposures. The fabrication of the integrated circuit may be effected in predominantly planar fashion in a single plane, but may also comprise a plurality of layers arranged one above another. Besides the formation of the integrated circuit in step S2, in step S3 the fusible links or switchable elements are provided in the semiconductor body. It is expedient to form the switchable elements as one-time switchable elements, preferably as fusible links.

Repeatedly switchable elements are for example capacitors which can be charged or discharged by means of a light-induced process. The integrated circuit realized in the semiconductor body is embodied for evaluating a state of the switchable elements. The switchable elements thus form a functional unit with the integrated circuit. The integrated circuit accordingly contains a multiplicity of configuration possibilities which are in each case prescribed by the switching state of the switchable elements.

In step S4, connection contacts are provided on the surface of the semiconductor body, or "die", and are connected to corresponding connection contacts of the later chip. The semiconductor body is then surrounded with a housing in step S5. In this case, however, the region of the semiconductor body in which the switchable elements are situated is left free and is thus accessible. The housing is accordingly configured in such a way that the partial region of the semiconductor body with the switchable elements can still be accessed even at a later point in time.

Afterward, in step S6, the chip component that has been produced is applied to a circuit board and the contact locations of the chip component are connected to the circuit board by means of a soldering process. Since, under certain circumstances, said soldering process generates high thermal loading within the semiconductor body and may thus lead to failures of elements of the integrated circuit, the functions of the integrated circuit are tested in a subsequent step S7. By way of example, specific signals are fed to the circuit and are processed by it. A result generated by the circuit is then checked for its correctness. In the case of a memory, by way of example, the memory cells are checked for defects during the functional test by means of data being written to said memory cells and being read out from them again.

If the test in step S8 proceeds without any errors, then all the functions are present correctly and the region previously left free in the housing is closed irreversibly in step S11. Suitable protection of the entire arrangement remains ensured. If the functional test proceeds negatively, then at least one element of the integrated circuit is defective. Therefore, step S9 involves determining the configuration in which the integrated circuit functions without any errors. If some memory cells have failed, for example, then redundant memory cells can be accessed.

Step S9 accordingly involves determining a configuration of the switchable elements and hence of the integrated circuit in which an error-free function of the integrated circuit is ensured. In step S10, the switchable elements required for this configuration are selectively fused and blown. By way of example, word lines with defective memory cells connected thereto are thus replaced by redundant word lines.

A test operation is then effected once again. If this test operation is successful, then step S11 is carried out and the housing is closed. If the test operation is not successful, it is necessary, if appropriate, to determine a new configuration. It is expedient to provide multiply switchable elements in such a case.

The method according to the invention makes it possible to reduce the rejects of defective components in a fabrication process. This is made possible by virtue of the fact that many fabrication steps that promote the failures are carried out before the test operation and at the same time the possibility is afforded of defining an error-free configuration only in a latest possible test step.

According to the invention, this is achieved by means of a memory component in which it is possible to access switchable elements for setting a configuration of the integrated circuit even after packaging and surrounding with a housing. The housing is formed with a transparent material or a detachable cover in a suitable manner for this purpose. Besides the embodiment with fuses illustrated here, it is also possible to use antifuses. The latter are brought to a conducting state by means of a process, for example by means of a laser-induced thermal fusing process.

LIST OF REFERENCE SYMBOLS

1: Chip component
2: Semiconductor body
3: Housing
4: Contact pads
5: Fuse banks
6, 62: Fusible links
24, 35: Partial regions
31: Housing
32: Cover
33: Depression
34: Adhesive
38: Contacts
9: Integrated circuit
9a: Circuit board
321: Groove
311: Spring
21, 22, 23, 25: Layers

221, 231, 251, 261: Switching elements
262: Light-transmissive layer
261: Light-opaque layer
67: Melting point

The invention claimed is:

1. A chip component, comprising:
   a semiconductor body;
   at least one switchable element disposed in a region of the semiconductor body that can be reached by light of at least one wavelength for the switching of the element;
   an integrated circuit disposed in the semiconductor body and designed to assume one configuration from a set of at least two possible configurations, said one configuration being defined by a state of the at least one switchable element; and
   a housing enclosing the semiconductor body, the housing having a region that is arranged at least partly above the region of the semiconductor body and is formed in such a way that the light can be fed to the region of the semiconductor body.

2. The chip component as claimed in claim 1, wherein the region of the housing comprises a light-transmissive material.

3. The chip component as claimed in claim 1, wherein the housing comprises a body having a depression and the semiconductor body is arranged in the depression in such a way that the region of the semiconductor body faces an opening of the depression.

4. The chip component as claimed in claim 1, wherein the region of the housing includes a detachable cover.

5. The chip component as claimed in claim 1, further comprising an adhesive that reversibly or irreversibly connects the region of the housing to the housing.

6. The chip component as claimed in claim 3, wherein the housing has a groove or a spring at at least one side wall and a cover that closes the opening of the depression, the cover being formed with a spring or groove matching the groove or spring of the housing.

7. The chip component as claimed in claim 1, wherein the switchable element comprises a one-time switchable element, a first switching state of the element being defined by an electrically conducting state of the element and a second switching state of the element being defined by an electrically blocking state.

8. The chip component as claimed in claim 1, wherein the switchable element comprises a fusible link.

9. The chip component as claimed in claim 1, wherein the integrated circuit comprises a writable memory.

10. The chip component as claimed in claim 1, wherein the region of the semiconductor body has a first layer that includes the at least one switchable element, and wherein the region further has a second layer that is arranged above the first layer and is transmissive to light of the at least one wavelength.

11. The chip component as claimed in claim 10, wherein the second layer comprises a material whose band gap is at least partly greater than energy of the light of the at least one wavelength.

12. The chip component as claimed in claim 10, wherein the second layer comprises a silicon dioxide layer.

* * * * *